United States Patent [19]
Narwankar et al.

[11] Patent Number: 6,136,685
[45] Date of Patent: Oct. 24, 2000

[54] HIGH DEPOSITION RATE RECIPE FOR LOW DIELECTRIC CONSTANT FILMS

[75] Inventors: Pravin Narwankar, Sunnyvale; Laxman Murugesh, Fremont; Turgut Sahin; Maciek Orczyk, both of Cupertino; Jianmin Qiao, Fremont, all of Calif.

[73] Assignee: Applied Materials, Inc., Santa Clara, Calif.

[21] Appl. No.: 08/868,595

[22] Filed: Jun. 3, 1997

[51] Int. Cl.$^7$ ............................................... H01L 21/4763
[52] U.S. Cl. ..................... 438/624; 438/761; 438/763; 438/784
[58] Field of Search ..................... 438/761, 695, 438/623, 788, 784, 763, 624; 427/573, 579

[56] References Cited

U.S. PATENT DOCUMENTS

| | | | |
|---|---|---|---|
| 4,468,413 | 8/1984 | Backmann | 65/391 |
| 4,851,370 | 7/1989 | Doklan et al. | 437/225 |
| 4,872,947 | 10/1989 | Wang et al. | 156/643 |
| 4,894,352 | 1/1990 | Lane et al. | 437/238 |
| 5,000,113 | 3/1991 | Wang et al. | 118/723 |
| 5,013,691 | 5/1991 | Lory et al. | 437/238 |
| 5,089,442 | 2/1992 | Olmer | 438/631 |
| 5,156,881 | 10/1992 | Okano et al. | 427/572 |
| 5,215,787 | 6/1993 | Homma | 427/248.1 |
| 5,271,972 | 12/1993 | Kwok et al. | 427/579 |
| 5,275,977 | 1/1994 | Otsubo et al. | 437/235 |
| 5,288,518 | 2/1994 | Homma | 427/255 |
| 5,314,724 | 5/1994 | Tsukune et al. | 427/489 |
| 5,319,247 | 6/1994 | Matsuura | 257/760 |
| 5,334,552 | 8/1994 | Homma | 437/195 |
| 5,385,763 | 1/1995 | Okano et al. | 427/572 |
| 5,399,529 | 3/1995 | Homma | 437/195 |
| 5,413,967 | 5/1995 | Matsuda et al. | 437/235 |
| 5,420,075 | 5/1995 | Homma et al. | 437/195 |
| 5,429,995 | 7/1995 | Nishiyama et al. | 437/238 |
| 5,474,589 | 12/1995 | Ohga et al. | 65/397 |
| 5,563,105 | 10/1996 | Dobuzinsky et al. | 438/788 |
| 5,571,576 | 11/1996 | Qian et al. | 427/574 |
| 5,648,175 | 7/1997 | Russell et al. | 428/472.3 |
| 5,661,093 | 8/1997 | Ravi et al. | 438/763 |
| 5,937,323 | 8/1999 | Orczyk et al. | 438/624 |

FOREIGN PATENT DOCUMENTS

| | | | |
|---|---|---|---|
| 61-276-977 | 12/1986 | Japan | C23C 16/50 |
| 4-239750 | 8/1992 | Japan | H01L 21/90 |
| 4-341568 | 11/1992 | Japan | C23C 16/40 |
| WO 92/20833 | 11/1992 | WIPO | C23C 16/00 |

OTHER PUBLICATIONS

Usami et al. "Low Dilectric Constant Interlayer Using Fluorine–Doped Silicon Oxide", Jpn. J. Appl. Phys. vol. 33, pp. 408–412, Jan. 1994.

Shapiro et al., "Dual Frequency Plasma CVD Fluorosilicate Glass Water Absorption And Stability", DUMIC Conference, Feb. 1995, pp. 118–123.

Takeishi et al., "Stabilizing Dielectric Constants of Fluorine–Doped–Si02 Films by N20–Plasma Annealing", DUMIC Conference, Feb. 1995, pp. 257–259.

(List continued on next page.)

*Primary Examiner*—Carl Whitehead, Jr.
*Assistant Examiner*—Maria Guerrero
*Attorney, Agent, or Firm*—Townsend & Townsend & Crew

[57] ABSTRACT

An insulating film with a low dielectric constant is more quickly formed on a substrate by reducing the co-etch rate as the film is deposited. The process gas is formed into a plasma from silicon-containing and fluorine-containing gases. The plasma is biased with an RF field to enhance deposition of the film. Deposition and etching occur simultaneously. The relative rate of deposition to etching is increased in the latter portion of the deposition process by decreasing the bias RF power, which decreases the surface temperature of the substrate and decreases sputtering and etching activities. Processing time is reduced compared to processes with fixed RF power levels. Film stability, retention of water by the film, and corrosion of structures on the substrate are all improved. The film has a relatively uniform and low dielectric constant and may fill trenches with aspect ratios of at least 4:1 and gaps less than 0.5 $\mu$m.

14 Claims, 12 Drawing Sheets

OTHER PUBLICATIONS

Carl et al., "The Effect of $O_2:C_2F_6$ Ratios and Low Frequency Power On The Gap Fill Properties And Stability Of F–TEOS Films", DUMIC Conference, Feb. 1995, pp. 234–240.

Matsuda et al., "Dual Frequency Plasma CVD Fluorosilicate Glass Deposition For 0.25 $\mu$m Interlevel Dielectrics", DUMIC Conference, Feb. 1995, pp. 22–28.

Qian et al., "High Density Plasma Deposition And Deep Submicron Gap Fill With Low Dielectric Constant SIOF Films", DUMIC Conference, Feb. 1995, pp. 50–56.

Fukada et al., "Preparation of SiOF Films with Low Dielectric Constant By ECR Plasma CVD", DUMIC Conference, Feb. 1995, pp. 43–49.

Ravi K. Laxman, "Low $\in$ Dielectrics: CVD Fluorinated Silicon Dioxides", Semiconductor International, May 1995, pp. 71–74.

Hayasaka et al., "High–Quality And Low Dielectric constant $SiO_2$ CVD Using High Density Plasma", Dry Process Symposium, Nov. 1994, pp. 163–168.

Musaka et al., "Single Step Gap Filling Technology For Subhalf Micron Metal Spacings On Plasma Enhanced $TEOS/0_2$ Chemical Vapor Deposition System", Extended Abstracts of the 1993 International Conference on Solid State Devices and Materials, Makuhari, 1993, pp. 510–512.

Robles et al., "Effects of RF Frequency and Deposition Rates on the Moisture Resistance of PECVD TEOS–Based Oxide Films", vol. 92–1, ECS Extended Abstracts, p. 215, Abstract 129, May 1992.

Galiano et al., "Stress–Temperature Behavior of Oxide Films Used For Intermetal Dielectric Applications", VMIC Conference, Jun. 1992, pp. 100–106.

Yu et al., "Step Coverage Study of Peteos Deposition for Intermetal Dielectric Applications", VMIC Conference, Jun. 1990, pp. 166–172.

Chang et al., "Frequency Effects and Properties of Plasma Deposited Fluorinated Silicon Nitride", J. Vac. Sci. Technol. B6 (2) 1988, pp. 524–532.

Thickness vs. time for constant $SiF_4:SiH_4$ ratios during deposition, as a fraction of the $SiF_4:SiH_4$ ratio Relative Dielectric Constant (K) vs. Film Thickness of an FSG Layer grown at a constant SiF$_4$: SiF$_4$ ratio

HIGH DEPOSITION RATE RECIPE FOR LOW DIELECTRIC CONSTANT FILMS

BACKGROUND OF THE INVENTION

The present invention relates to the fabrication of integrated circuits. More particularly, the invention provides a technique, including a method and apparatus, for the deposition of a reduced-dielectric-constant, fluorine-doped insulating film in high-aspect-ratio trenches on semiconductor substrates.

One of the primary steps in the fabrication of modern semiconductor devices is the formation of a thin film on a semiconductor substrate by chemical reaction of gases. Such a deposition process is referred to as chemical vapor deposition (CVD). Thermal CVD processes supply reactive gases to the substrate surface where heat-induced chemical reactions take place to produce a desired film.

The temperature needed for the surface reactions to occur can be reduced if a plasma is formed from the gases within the deposition chamber. Plasma promotes dissociation of the gases by the application of radio frequency (RF) energy to a reaction zone near the substrate surface, thereby creating a plasma of reactive species. The reactivity of the plasma species reduces the energy required for a chemical reaction to take place, and thus lowers the required temperature for such CVD processes.

The relatively low temperature of a plasma CVD process makes such a process ideal for the formation of insulating layers over deposited metal layers and for the formation of other insulating layers. In fact, while higher temperatures generally result in a higher deposition rate in thermal CVD processes, lower temperatures may result in higher deposition rates in plasma-assisted processes.

Semiconductor device density on chips has dramatically increased since such chips were first introduced several decades ago. One way to increase device density on a chip is to decrease the area per device. Typically, as device area decreases, the aspect ratios, i.e., the height relative to the width, of features on the device often increase. This is particularly true for metallization traces that maintain a cross-sectional area sufficient to carry the current required for device operation.

Additionally, as device area decreases, the spacing between device features gets smaller. Today's devices often have geometries with less than 1 $\mu$m spacing between features. These effects combine to form closely spaced, high-aspect-ratio gaps that benefit from being filled with dielectric material.

Narrow, high-aspect-ratio gaps are difficult to fill in prior art CVD processes because the CVD material, accumulating on the corners of adjacent features as overhangs, often closes the gap from both sides before the gap is filled. FIG. 1A shows a vertical cross-sectional view of a partially processed substrate. The substrate has a conductive layer 115. This layer was previously deposited on substrate 100. Substrate 100 may be a wafer, specifically a semiconductor wafer, and more specifically, a silicon wafer. A first portion of a dielectric layer 130 has been deposited over the substrate. As shown, dielectric material has accumulated at the edges 135 to form overhangs 140.

FIG. 1B shows a vertical cross-sectional view of a substrate upon completion of the deposition of layer 150. Overhangs 140 have grown together, leaving an interior gap 145. This gap can cause problems relating to device fabrication, operation, and reliability. Various methods have been employed in an attempt to avoid forming this gap. One method is to deposit a partial layer of CVD dielectric, then to spin on a layer of low-melting-point glass that is subsequently heated so that it flows into and fills the gap. Other methods use sequential or concurrent deposition and sputtering to keep the gaps open until they are filled. Using a simultaneous deposition and etching process may also keep the gaps open until they are filled.

Because fluorine (F) is an etching species, fluorine simultaneously etches the layer as it is being deposited, and helps to keep the gaps open until they are filled. The simultaneous deposition and etching allows fluorine-doped silicon oxide films to have improved gap filling capabilities, such that the films are able to adequately fill gaps having an aspect ratio of between 1.8 to 4, or more, between adjacent metal layers. As is well known to those skilled in the art, fluorine-doped silicon oxide films are basically silicon dioxide modified with fluorine, and may vary in the local or the overall stoichiometric ratio of silicon to oxygen, and may be in an amorphous phase or a crystalline phase, or combinations thereof.

Another problem associated with higher device densities relates to the parasitic capacitive effects between conductive layers. Reducing the spacing between conductive layers often has the effect of bringing the plates of a capacitor closer together. This increases unwanted capacitance, resulting in several undesirable effects. For example, the resistive-capacitive (RC) time constant of a conductive trace may increase, requiring greater power for the same speed of operation of the circuit, or conductive layers may capacitively couple, resulting in "crosstalk." Lowering the dielectric constant of insulating layers between conductive layers would reduce these undesired effects by reducing the capacitance.

Many approaches to obtain lower dielectric constants have been proposed. One of the more promising solutions is the incorporation of fluorine or other halogen elements, such as chlorine or bromine, into a silicon oxide $(S_iO_x)$ layer. Examples of halogen incorporation in films are described in U.S. patent application Ser. Nos. 08/548,391, filed Oct. 25, 1995 and entitled "METHOD AND APPARATUS FOR IMPROVING FILM STABILITY OF HALOGEN-DOPED SILICON OXIDE FILMS", 08/538,696, filed Oct. 2, 1995 and entitled "USE OF $SIF_4$ TO DEPOSIT F-DOPED FILMS OF GREATER STABILITY", which are assigned to Applied Materials, Inc.

It is believed that fluorine, the preferred halogen dopant for silicon oxide films, lowers the dielectric constant of the silicon oxide film because fluorine is an electronegative atom that decreases the polarizability of the overall SiO-F network. Fluorinated silicon oxide films are also referred to as fluorinated silicon glass (FSG) films. Unfortunately, FSG layers may take a relatively long time to deposit.

FIG. 2 shows that increasing the relative concentration of silicon tetrafluoride silane $(SiF_4)$ to $(SiH_4)$ increases the time required to deposit a given thickness of dielectric, and that the rate of deposition decreases with increasing time or layer thickness. It is believed that this occurs because the plasma heats the surface of the layer as it grows. Fluorine acts as an etchant of the layer, and etching is more pronounced at higher temperatures and at higher fluorine concentrations.

Another factor affecting the deposition rate of the layer is that the layer may dissociate back into the plasma more rapidly at higher temperatures. This dissociation is in addition to any plasma etching and fluorine etching that may occur.

However, it is believed that more fluorine is incorporated into the growing layer at higher temperatures. Fluorine that is not incorporated, or is loosely incorporated, into the layer may remain as free fluorine. Free fluorine may absorb water, increasing the dielectric constant of the layer, and may form hydrofluoric acid, which can attack metal and oxide layers on the layer.

Incorporated fluorine reduces the dielectric constant of the layer, which is a desirable characteristic. However, the higher temperatures that increase fluorine incorporation also increase the etch rate and dissociation of the layer. Therefore, the desired temperature for greatest fluorine incorporation may result in an unattractively slow deposition rate.

FIG. 3 shows that the dielectric constant of a continuously deposited, fluorine-doped layer decreases with thickness. Therefore, a layer 401 deposited in a single step may have a graded dielectric constant, as shown in FIG. 4. Although the entire layer is shown as a sum of four sublayers, this is a representation. It is likely that the dielectric constant decreases in a monotonic fashion from an initial high value to a final low value. It is believed that this is due to the surface temperature of the layer increasing with time, which increases the fluorine concentration in the layer and reduces the dielectric constant.

Thus, manufacturers desire to include fluorine in various dielectric layers, and particularly in intermetal dielectric layers, to lower the dielectric constant. It is also desired that these layers be deposited in the least amount of time, and that the dielectric constant be fairly uniform across the layer. It is further desired that these layers fill gaps between features less than 0.5 $\mu$m apart with an aspect ratio greater than 1.8.

SUMMARY OF THE INVENTION

The present invention solves the problems described above by providing an efficient process for depositing a layer of halogen-doped silicon dioxide, with a nearly uniform dielectric constant less than 4, in high-aspect-ratio trenches on a substrate. The material is deposited from chemical vapor, preferably in a high-density plasma-chemical vapor deposition (HDP-CVD) system, such as an Applied Materials, Inc. Ultima System.

A high-aspect-ratio trench may be formed from prior processing steps, such as aluminum deposition and patterning steps on a silicon wafer, the trench being at least about 1.8 times higher than it is wide. The gap in such a trench may be narrow, such as from about 0.5 to 0.18 $\mu$m, or less. In order to fill the trench without leaving voids, an HDP-CVD system uses deposition gases, such as $SiH_4$ and oxygen, halogen-containing gas, such as $SiF_4$, and a sputtering gas, such as argon, in a plasma-assisted deposition process. The HDP-CVD system has an RF source power supply and an RF bias power supply that provide the RF energy delivered to the plasma. The combination of source RF energy and bias RF energy helps to prevent damage to pre-existing features on the substrate while providing a high density plasma.

As the layer is deposited, it is concurrently etched. Etching arises from both nonreactive (also known as sputter-etching), and reactive (etchant), plasma species. The RF bias power applied to the plasma is reduced during the process to reduce the surface temperature of the substrate during layer formation, which reduces the reactivity of the etchant species, and to reduce the sputtering component of the plasma. Reducing the surface temperature of the substrate increases the net deposition rate under some process conditions. This provides efficient gap-filling characteristics by keeping high-aspect-ratio trenches open while they fill in. This process results in a low-dielectric-constant, halogen-doped silicon dioxide layer at a higher rate of deposition than present processes allow.

In one embodiment, the RF bias power is reduced during the deposition process to reduce the surface temperature of the substrate and hence increase the rate of deposition relative to the rate of etching. The bias power is maintained at a level sufficient to promote rapid growth of the deposited layer under the conditions present in the deposition system. In this embodiment, the flow of deposition and etchant gases may be increased to further increase the net deposition rate.

In another embodiment, a process gas comprising at least a silicon source, an oxygen source, and a fluorine source is introduced into a reaction chamber to deposit a FSG film. The process gas may also comprise a nonreactive sputtering gas, such as argon. The initial ratio of fluorine to silicon is high enough to ensure that the first portion of the FSG film has a low dielectric constant, and to ensure a proper deposition-to-etch ratio so that the gaps between device features remain open while the trench is filled. The concentration of the etchant-containing gas relative to the deposition gas is reduced during the deposition of the layer to increase the deposition-to-etch ratio and insure that the layer is deposited in a timely manner.

The deposition to etch ratio is a combination of many factors. The plasma has a source component, which dissociates the atoms and molecules of the chamber gases into a plasma, and a bias component, which moves the plasma species to and from the surface of the forming layer. The bias component conveys deposition ions to the layer surface for combination into the layer material, knocks loose layer material via sputtering, and conveys etchant ions to the surface, removing some layer material by etching.

The deposition-to-etch ratio may be increased by either increasing the deposition rate at a substantially constant etch rate, or by decreasing the etch rate at a substantially constant deposition rate. Decreasing the RF bias energy increases the deposition-to-etch ratio because it both decreases the etch rate by decreasing the activity of the etchant species, and increases the deposition rate by reducing the surface temperature of the substrate, which increases the rate of growth of the layer.

For a further understanding of the objects and advantages of the present invention, reference should be made to the ensuing detailed description taken in conjunction with the accompanying drawings.

DESCRIPTION OF THE PREFERRED EMBODIMENTS

I. Introduction

In one embodiment, a halogen-doped layer of silicon dioxide having a dielectric constant less than undoped silicon glass is deposited in a standard HDP-CVD system. A high deposition rate is achieved by varying the etching effect of the fluorine while the layer is deposited. The resulting layer has a more uniform dielectric constant and less free fluorine than similar layers grown by other methods.

II. An Exemplary CVD System

Figure 5A:
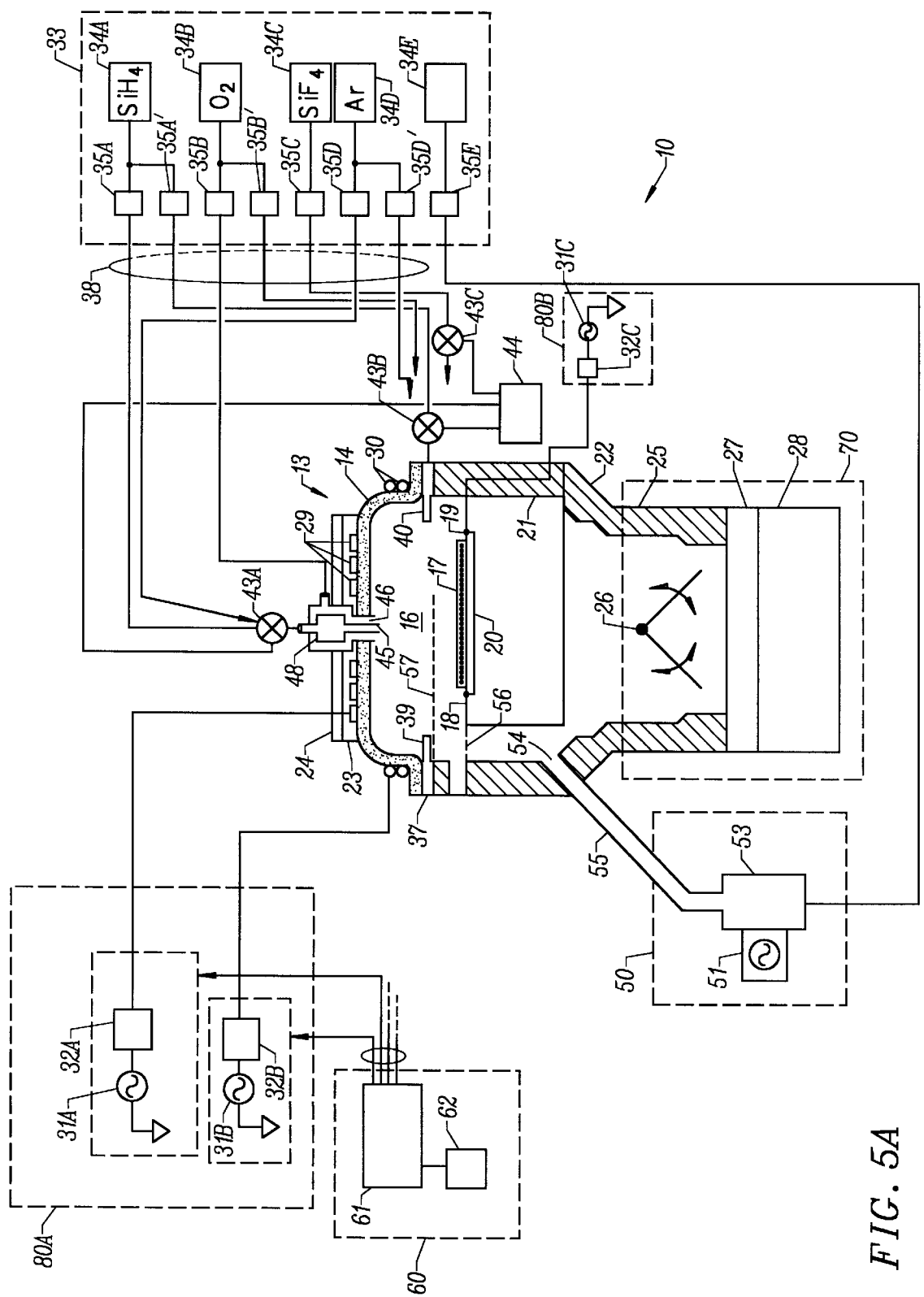
FIG. 5A is a simplified diagram of one embodiment of a HDP-CVD system according to the present invention.

FIG. 5A illustrates one embodiment of a HDP-CVD system 10, in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a dielectric material, such as alumina or aluminum nitride. Dome 14 defines an upper boundary of a plasma processing region 16. Plasma processing region 16 is bounded on the bottom by the upper surface of substrate 17 and the substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. A motor (not shown) raises and lowers a lift-pin plate (not shown) that raises and lowers lift pins (not shown) that raise and lower the wafer. Upon transfer into chamber 13, substrates are loaded onto the raised lift pins, and then lowered to a substrate receiving portion 19 of substrate support member 18. Substrate receiving portion 19 includes an electrostatic chuck 20 that secures the substrate to substrate support member 18 during substrate processing.

Vacuum system 70 includes throttle body 25, which houses twin-blade throttle valve 26 and is attached to gate valve 27 and turbomolecular pump 28. It should be noted that throttle body 25 offers minimum obstruction to gas flow, and allows symmetric pumping, as described in co-pending, co-assigned United States Patent Application, originally filed on filed Dec. 12, 1995, and assigned Ser. No. 08/574,839, refiled on Sep. 11, 1996 and assigned Ser. No. 08/712724 entitled "SYMMETRIC CHAMBER". Gate valve 27 can isolate pump 28 from throttle body 25, and can also control chamber pressure by restricting the exhaust flow capacity when throttle valve 26 is fully open. The arrangement of the throttle valves, gate valve, and turbomolecular pump allow accurate and stable control of chamber pressures from about 1 to 100 millitorr.

The source plasma system 80A includes a top coil 29 and side coil 30, mounted on dome 14. A symmetrical ground shield (not shown) reduces electrical coupling between the coils. Top coil 29 is powered by top source RF generator 31A, while side coil 30 is powered by side source RF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complementary electrode. In a specific embodiment, the top source RF generator 31A provides up to 2500 W of RF power at nominally 2 MHz and the side source RF generator 31B provides up to 5000 W of RF power at nominally 2 MHz. The operating frequencies of the top and side RF generators may be offset from the nominal operating frequency (e.g., to 1.7–1.9 MHz and 1.9–2.1 MHz, respectively) to improve plasma-generation efficiency.

A bias plasma system 80B includes a bias RF generator 31C and a bias matching network 32C. The bias plasma system 80B capacitively couples substrate receiving portion 19 to body member 22, which act as complementary electrodes. The bias plasma system 80B serves to enhance the transport of plasma species created by the source plasma system 80A to the surface of the substrate. In a specific embodiment, bias RF generator provides up to 5000 W of RF power at 13.56 MHz.

In addition to the RF fields that are created within process zone 16, a direct current (DC) field may be created within process zone 16. For example, providing a negative DC potential to substrate receiving portion 19 relative to body member 22 may promote the transport of positively charged ions to the surface of substrate 17.

RF generators 31A and 31B include digitally controlled synthesizers and operate over a frequency range from about 1.7 to about 2.1 MHz. Each generator includes an RF control circuit (not shown) that measures reflected power from the chamber and coil back to the generator, and adjusts the frequency of operation to obtain the lowest reflected power, as understood by a person of ordinary skill in the art. RF generators are typically designed to operate into a load with a characteristic impedance of 50-Ω. RF power may be reflected from loads that have a different characteristic impedance than the generator. This can reduce power transferred to the load. Additionally, power reflected from the load back to the generator may overload and damage the generator. Because the impedance of a plasma may range from less than 5-Ω to over 900-Ω, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 5B:
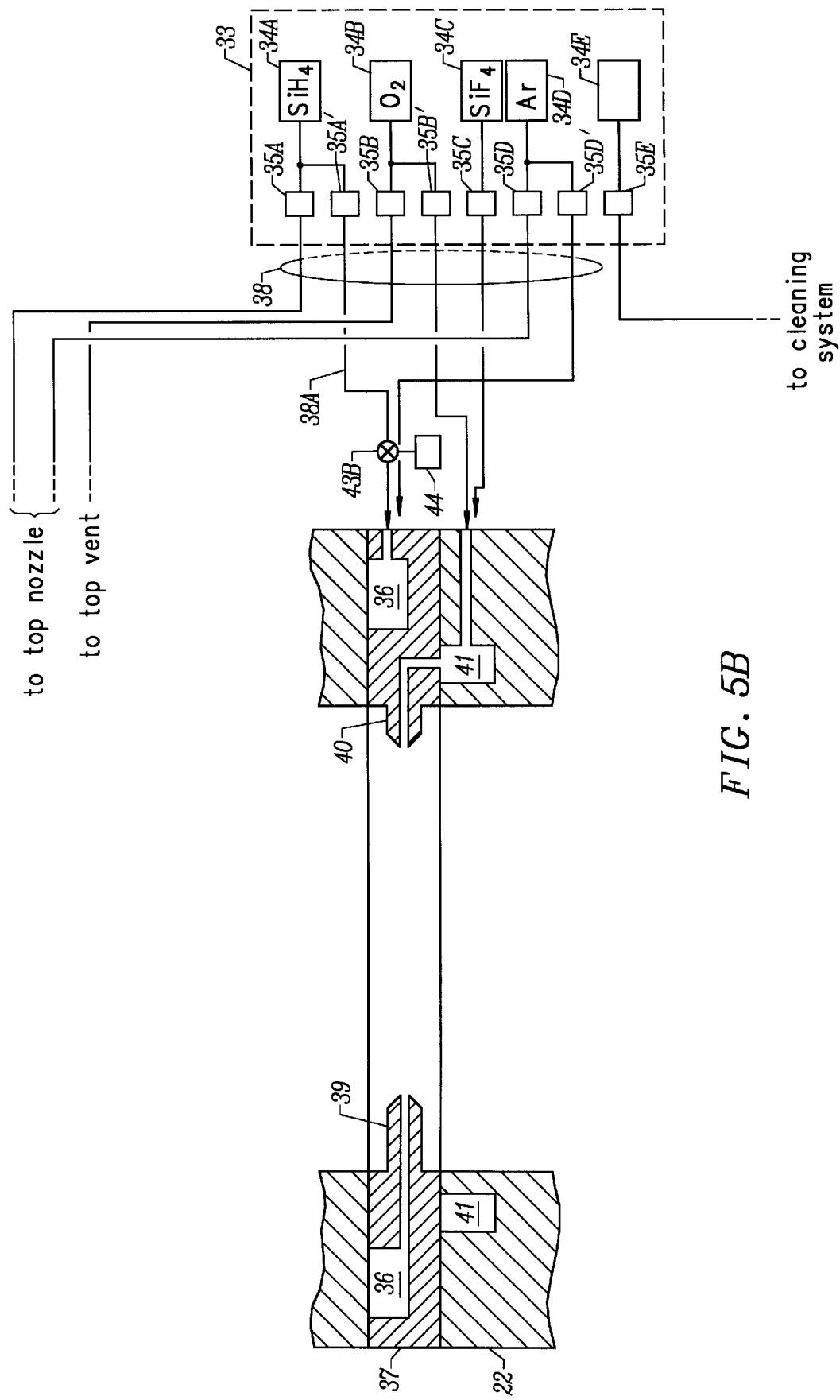
FIG. 5B is a simplified cross section of a gas ring that may be used in conjunction with the exemplary CVD processing chamber of FIG. 5A.

A gas delivery system 33 provides gases from several sources to the chamber for processing the substrate via gas delivery lines 38 (only some of which are shown). Gases are introduced into chamber 13 through a gas ring 37, a top nozzle 45, and a top vent 46. FIG. 5B is a simplified, partial cross-sectional view of chamber 13 showing additional details of gas ring 37.

FIG. 5B shows one embodiment where first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of gas nozzles 39 and 40 (only two of which is shown) that provide a uniform flow of gas over the substrate. Nozzle length and nozzle angle may be changed by changing gas ring 37. This allows tailoring the uniformity profile and gas utilization efficiency for a particular process within an individual chamber. In a specific embodiment, the gas ring 37 has a total of twenty-four gas nozzles, twelve first gas nozzles 40 and twelve second gas nozzles 39.

Gas ring 37 has a plurality of first gas nozzles 40 (only one of which is shown), which in a preferred embodiment are coplanar with, and shorter than, a plurality of second gas nozzles 39. In one embodiment, first gas nozzles 40 receive one or more gases from body plenum 41, and second gas nozzles 39 receive one or more gases from gas ring plenum 36. In some embodiments, it is desirable not to mix gases in the body plenum 41 and the gas ring plenum 36 before injecting the gases into the chamber 13, such as when the first gas nozzles are used to deliver oxidizer gas and the second gas nozzles are used to deliver source gas. In other embodiments, process gases may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In some embodiments, flammable, toxic, or corrosive gases, such as silane or silicon tetrafluoride, may be used. In these instances, it may be desirable to eliminate gas remaining in the gas delivery lines after a deposition. This may be accomplished using a three-way valve, such as valve 43B, to isolate chamber 13 from delivery line 38A, and to vent delivery line 38A to vacuum foreline 44, for example. As shown in FIG. 5A, other similar valves, such as 43A and 43C, may be incorporated on other gas delivery lines, such as 35A and 35C. Such three-way valves may be placed as close to chamber 13 as practical, to minimize the volume of the unvented gas delivery line (between the three-way valve and the chamber). Additionally, two-way (on-off) valves (not shown) may be placed between a mass flow controller (MFC) and the chamber or between a gas source and an MFC.

Referring again to FIG. 5A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45 through which gas may flow into the chamber from the gas delivery system. In one embodiment, first gas source 34A is a silane source that supplies second gas nozzles 39 and top nozzle 45. Source nozzle MFC 35A' controls the amount of silane delivered to second gas nozzles 39 and top nozzle MFC 35A controls the amount of silane delivered to top gas nozzle 45. Similarly, two MFCs 35B and 35B' may be used to control the flow of oxygen to both top vent 46 and first gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E, such as fluorine, silicon tetrafluoride, or equivalents, in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) should be resistant to attack by the plasma. The distance between reactor cavity 53 and feed port 54 should be kept as short as practical, as the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in an in situ plasma. Consequently, relatively sensitive components, such as electrostatic chuck 20, do not need to be covered, with a dummy wafer or otherwise protected, as may be required with an in situ plasma cleaning process. During the cleaning process, or other processes, the gate valve 27 may be closed to isolate the turbomolecular vacuum pump 28 from the chamber. In this configuration, the foreline 44 provides a process vacuum generated by remote vacuum pumps, which are typically mechanical vacuum pumps. Isolating the turbomolecular pump from the chamber with the gate valve protects the turbomolecular pump from corrosive compounds or other potentially harmful effects resulting from the chamber clean or other processes.

System controller 60 controls the operation of system 10. In a preferred embodiment, controller 60 includes a memory 62, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure as having a 16-bit data bus and 24-bit address bus. System controller 31 operates under the control of a computer program stored on the hard disk drive or other computer programs, such as programs stored on a floppy disk. The computer program dictates, for example, the timing, mixture of gases, RF power levels and other parameters of a particular process. The interface between a user and the system controller is via a monitor, such as a cathode ray tube (CRT) 65, and a light pen 66, as depicted in FIG. 5C.

Figure 5C:
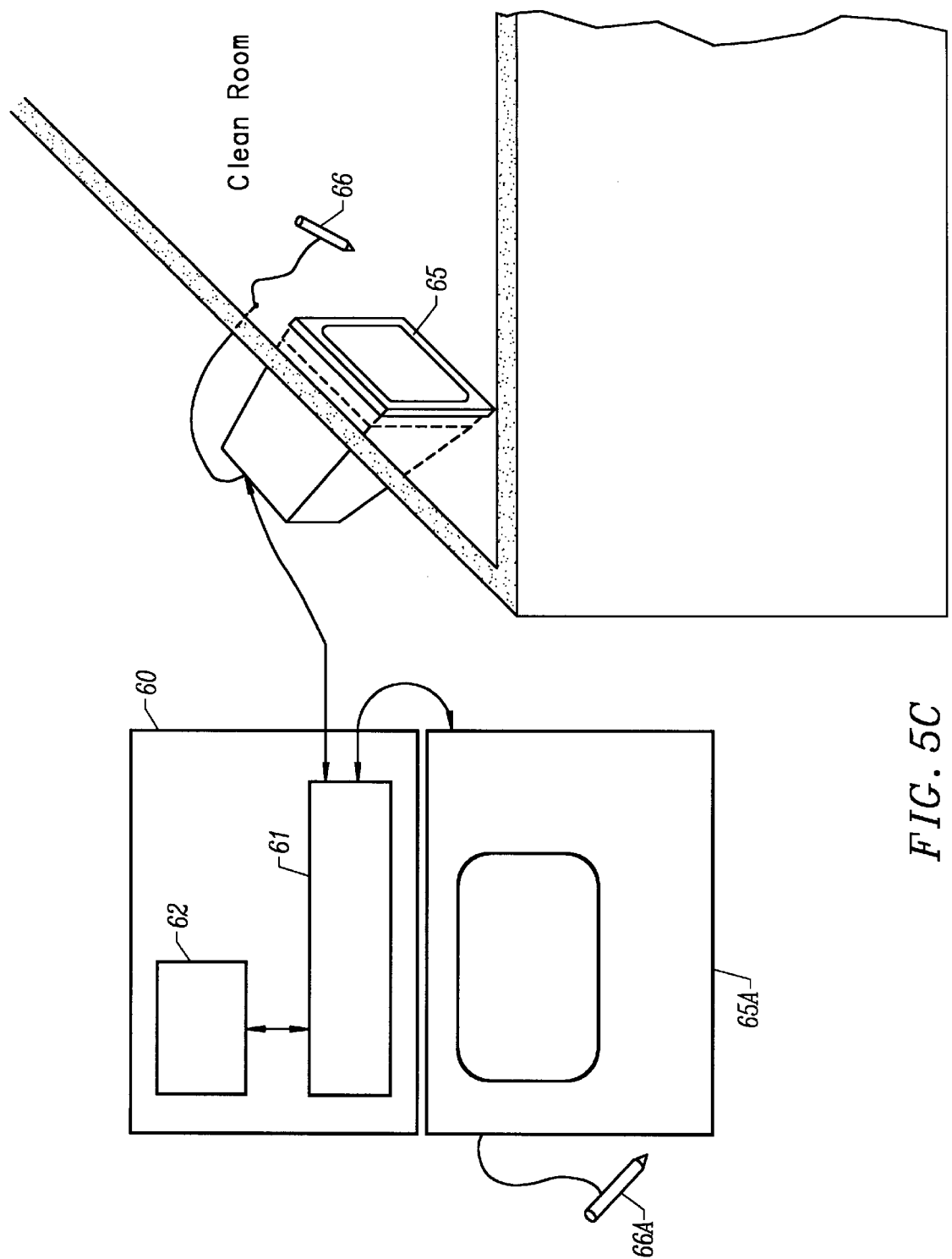
FIG. 5C is a simplified diagram of a monitor and light pen that may be used in conjunction with the exemplary CVD processing chamber of FIG. 5A.

FIG. 5C is an illustration of a portion of an exemplary system user interface used in conjunction with the exemplary CVD processing chamber of FIG. 5A. System controller 60 includes a processor 61 coupled to a memory 62. Preferably, memory 62 may be a hard disk drive, but of course memory 62 may be other kinds of memory, such as ROM, PROM, and others.

System controller 60 operates under the control of a computer program. The computer program dictates the timing, temperatures, gas flows, RF power levels and other parameters of a particular process. The interface between a user and the system controller is via a CRT monitor 65 and a light pen 66 and two light pens, 66 as depicted in FIG. 5C. In a preferred embodiment, two monitors, 65 and 65A and two light pens, 66 and 66A, are used, one monitor is mounted in the clean room wall (65) for the operators and the other behind the wall monitor is (65A) for the service technicians. Both monitors simultaneously display the same information, but only one light pen (e.g., 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer readable programming language such as 68000 assembly language, C, C++, or Pascal. Suitable program code is entered into a single file, or multiple files, using a conventional text editor, and stored or embodied in a computer-usable medium, such as a memory system of the computer. If the entered code text is in a high level language, the code is compiled, and the resultant compiler code is then linked with an object code of precompiled Windows library routines. To execute the linked, compiled object code, the system user invokes the object code, causing the computer system to load the code in memory, from which the CPU reads and executes the code to perform the tasks identified in the program.

Figure 5D:
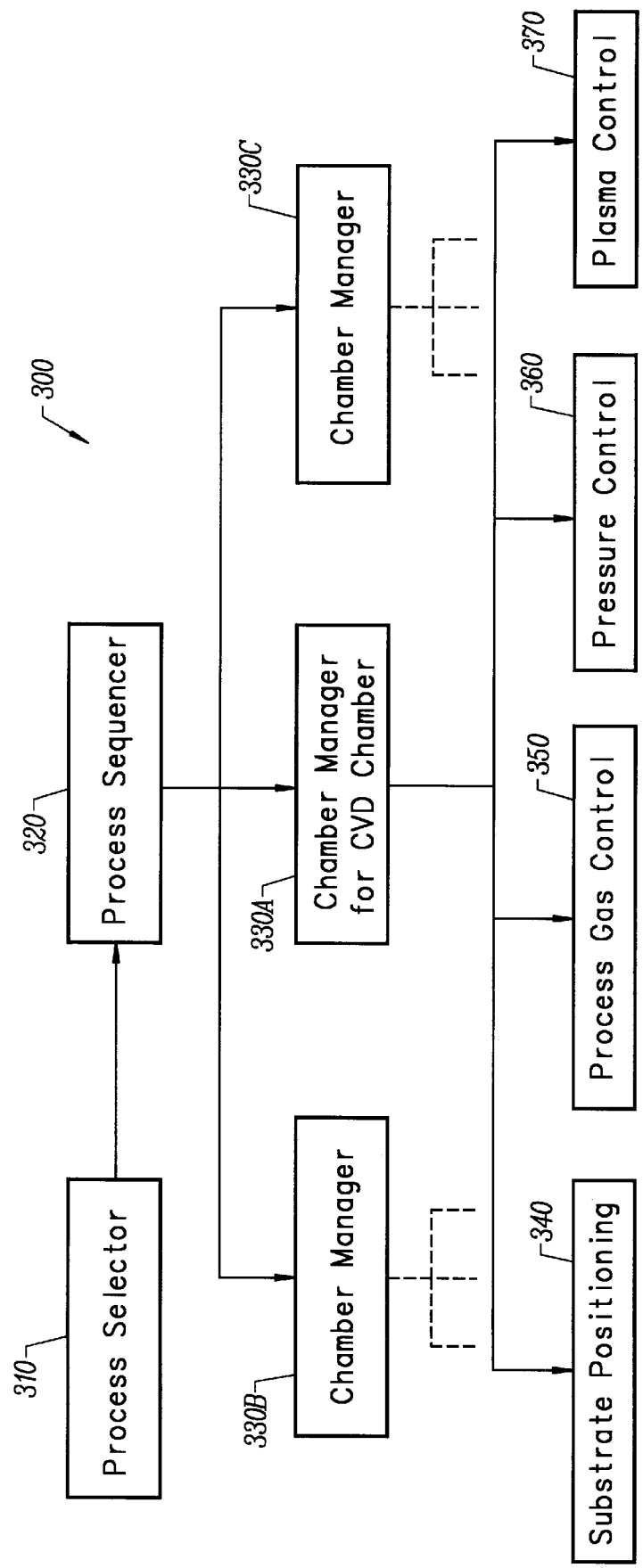
FIG. 5D is a flow chart of an exemplary process control computer program product used to control the exemplary CVD processing chamber of FIG. 5A.

FIG. 5D shows an illustrative block diagram of the hierarchical control structure of computer program 300. A user enters a process set number and process chamber number into a process selector subroutine 310 in response to menus or screens displayed on the CRT monitor by using the light pen interface. The process sets are predetermined sets of process parameters necessary to carry out specified processes, and are identified by predefined set numbers. Process selector subroutine 310 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of system controller 60.

A process sequencer subroutine 320 comprises program code for accepting the identified process chamber and set of process parameters from the process selector subroutine 310, and for controlling operation of the various process chambers. Multiple users can enter process set numbers and process chamber numbers, or a user can enter multiple process set numbers and process chamber numbers, so sequencer subroutine 320 operates to schedule the selected processes in the desired sequence. Preferably, sequencer subroutine 320 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 320 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 320 determines which process chamber and process set combination is going to be executed next, sequencer subroutine 320 causes execution of the process set by passing the particular process set parameters to a chamber manager subroutine 330A–C, which controls multiple processing tasks in chamber 13 and possibly other chambers (not shown) according to the process set determined by sequencer subroutine 320.

Examples of chamber component subroutines are substrate positioning subroutine 340, process gas control subroutine 350, pressure control subroutine 360, and plasma control subroutine 370. Those having ordinary skill in the art will recognize that other chamber control subroutines can be included depending on what processes are desired to be performed in chamber 13. In operation, chamber manager subroutine 330A selectively schedules or calls the process component subroutines in accordance with the particular process set being executed. Scheduling by chamber manager subroutine 330A is performed in a manner similar to that used by sequencer subroutine 320 in scheduling which process chamber and process set to execute. Typically, chamber manager subroutine 330A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 5D. Substrate positioning subroutine 340 comprises program code for controlling chamber components that are used to load a substrate onto substrate support number 18. Substrate positioning subroutine 340 may also control transfer of a substrate into chamber 13 from, e.g., a plasma-enhanced CVD (PECVD) reactor or other reactor in the multichamber system, after other processing has been completed.

Process gas control subroutine 350 has a program code for controlling process gas composition and flow rates. Subroutine 350 controls the open/close position of the safety shut-off valves, and also ramps up/down the mass flow controllers to obtain the desired gas flow rates. All chamber component subroutines, including process gas control subroutine 350, are invoked by chamber manager subroutine 330A. Subroutine 350 receives process parameters from chamber manager subroutine 330A related to the desired gas flow rates.

Typically, process gas control subroutine 350 operates by opening the gas supply lines, and repeatedly (i) reading the necessary mass flow controllers, (ii) comparing the readings to the desired flow rates received from chamber manager subroutine 330A, and (iii) adjusting the flow rates of the gas supply lines as necessary. Furthermore, process gas control subroutine 350 may include steps for monitoring the gas flow rates for unsafe rates, and activating the safety shut-off valves when an unsafe condition is detected.

In some processes, an inert gas, such as argon, is flowed into chamber 13 to stabilize the pressure in the chamber before reactive process gases are introduced into the chamber. For these processes, the process gas control subroutine 350 is programmed to include steps for flowing the inert gas into chamber 13 for an amount of time necessary to stabilize the pressure in the chamber. The above-described steps may then be carried out.

Additionally, when a process gas is to be vaporized from a liquid precursor, for example, tetraethoxysilane (TEOS), the process gas control subroutine 350 may include steps for bubbling a delivery gas such as helium through the liquid precursor in a bubbler assembly or for introducing the helium to a liquid injection valve. For this type of process, the process gas control subroutine 350 regulates the flow of the delivery gas, the pressure in the bubbler, and the bubbler temperature to obtain the desired process gas flow rates. As discussed above, the desired process gas flow rates are transferred to process gas control subroutine 350 as process parameters.

Furthermore, the process gas control subroutine 350 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared with the necessary values and adjusted accordingly.

The process gas control subroutine 350 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 360 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, size of the process chamber, and pumping capacity. The first method sets throttle valve 26 to a fixed position. Setting throttle valve 26 to a fixed position may eventually result in a steady-state pressure.

Alternatively, the chamber pressure may be measured with a manometer, for example, and throttle valve 26 position may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 360 is invoked, the desired (or target) pressure level is received as a parameter from chamber manager subroutine 330A. Pressure control subroutine 360 operates to measure the pressure in chamber 13 by reading one or more conventional pressure manometers connected to the chamber, compare the measure value (s) with the target pressure, obtain proportional, integral, and differential (PID) values from a stored pressure table corresponding to the target pressure, and adjust throttle valve 26 according to the PID values obtained from the pressure table. Alternatively, pressure control subroutine 360 may open or close throttle valve 26 to a particular opening size to regulate the pressure in chamber 13 to a desired pressure or pressure range.

Plasma control subroutine 370 comprises program code for controlling the frequency and power output setting of RF generators 31A and 31B, and for tuning matching networks 32A and 32B. Plasma control subroutine 370, like the previously described chamber component subroutines, is invoked by chamber manager subroutine 330A.

An example of a system which may incorporate some or all of the subsystems and routines described above would be an Ultima System, manufactured by Applied Materials, configured to practice the present invention.

III. Exemplary Structure

Figure 6:
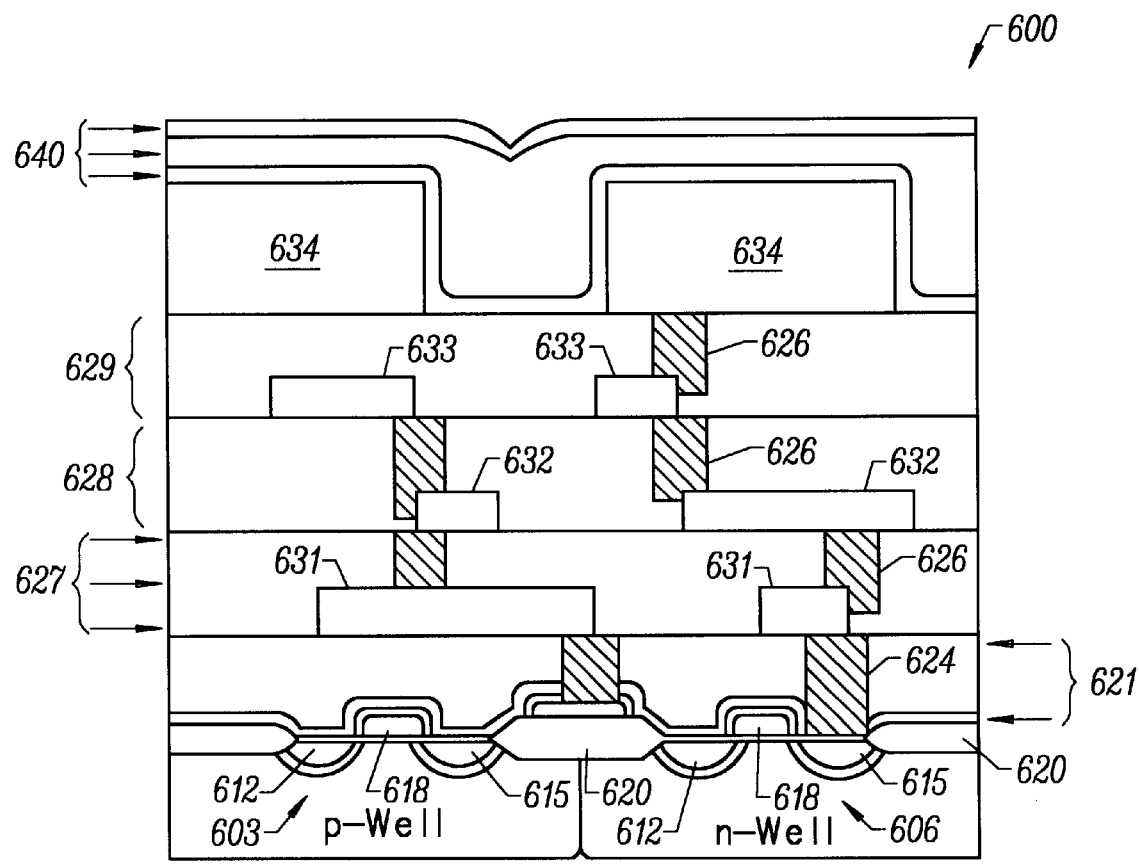
FIG. 6 is a simplified cross-sectional view of an integrated circuit according to the present invention.

FIG. 6 illustrates a simplified cross-sectional view of an integrated circuit 600 incorporating features of the present invention. As shown in FIG. 6, integrated circuit 600 includes NMOS and PMOS transistors 603 and 606, which are separated and electrically isolated from each other by a field oxide region 620. Each transistor 603 and 606 comprises a source region 612, a gate region 615, and a drain region 618.

A premetal dielectric layer 621 separates transistors 603 and 606 from metal layer 631, with connections between metal layer 631 and the transistors made by contacts 624. Metal layer 631 is one of four metal layers, 631–634, included in integrated circuit 600. Each metal layer 631–634 is separated from adjacent metal layers by respective intermetal dielectric layers 627, 628, and 629, and may be formed by processing steps such as aluminum deposition and patterning. Adjacent metal layers are connected at selected openings by vias 626. Deposited over metal layer 634 are planarized passivation layers 640.

Embodiments of the present invention are particularly useful for intermetal dielectric (IMD) layers, but may find uses in each of the dielectric layers shown in integrated circuit 600. It should be noted that as the aspect ratios of conductive traces increases and the gap spacing between these traces decreases, relevant IMD layers lie in the vertical plane, as well as the horizontal plane. The simplified integrated circuit 600 is for illustrative purposes only. One of ordinary skill in the art could implement the present method for fabrication of other integrated circuits such as microprocessors, application-specific integrated circuits (ASICs), memory devices, and the like. Additionally, the method of the present invention may be used in the fabrication of integrated circuits using other technologies such as BiCMOS, NMOS, bipolar and others.

IV. Deposition of Low-Dielectric-Constant FSG Films

Figure 1A:
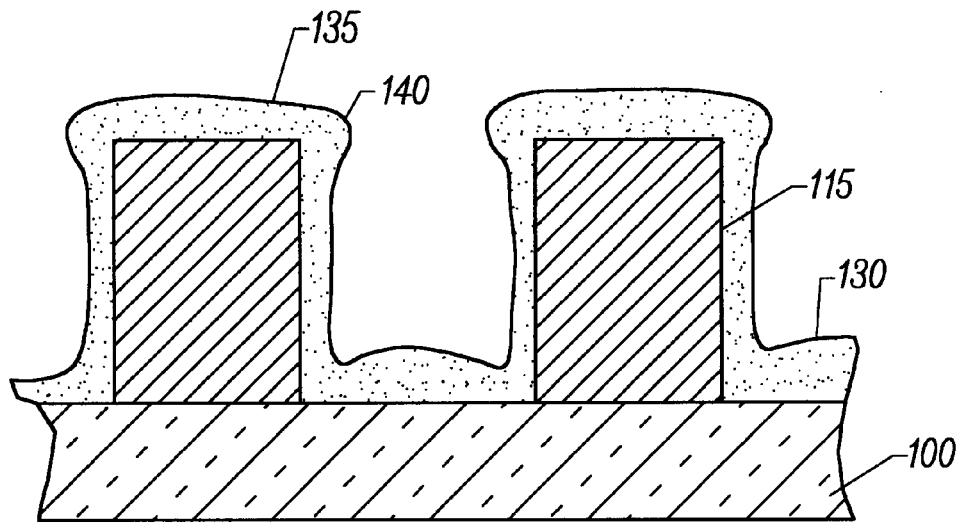
FIG. 1A is a vertical cross-sectional view of a partially processed prior-art substrate, showing the accumulation of deposit on the edges of the features defining high-aspect-ratio trenches.
Figure 1B:
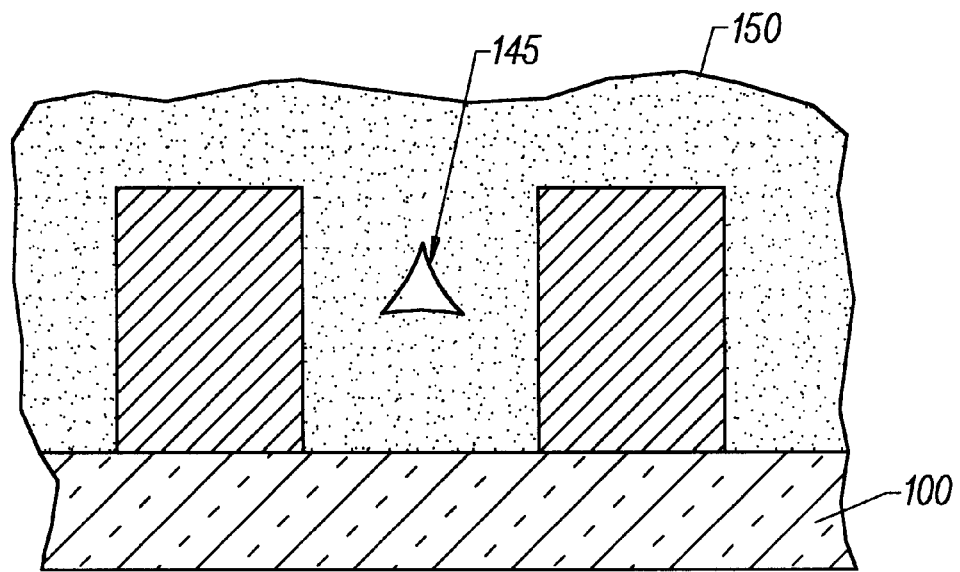
FIG. 1B is a vertical cross-sectional view of the prior-art substrate of FIG. 1A, showing the voids formed in the high-aspect-ratio trenches on completion of the deposition process.
Figure 2:
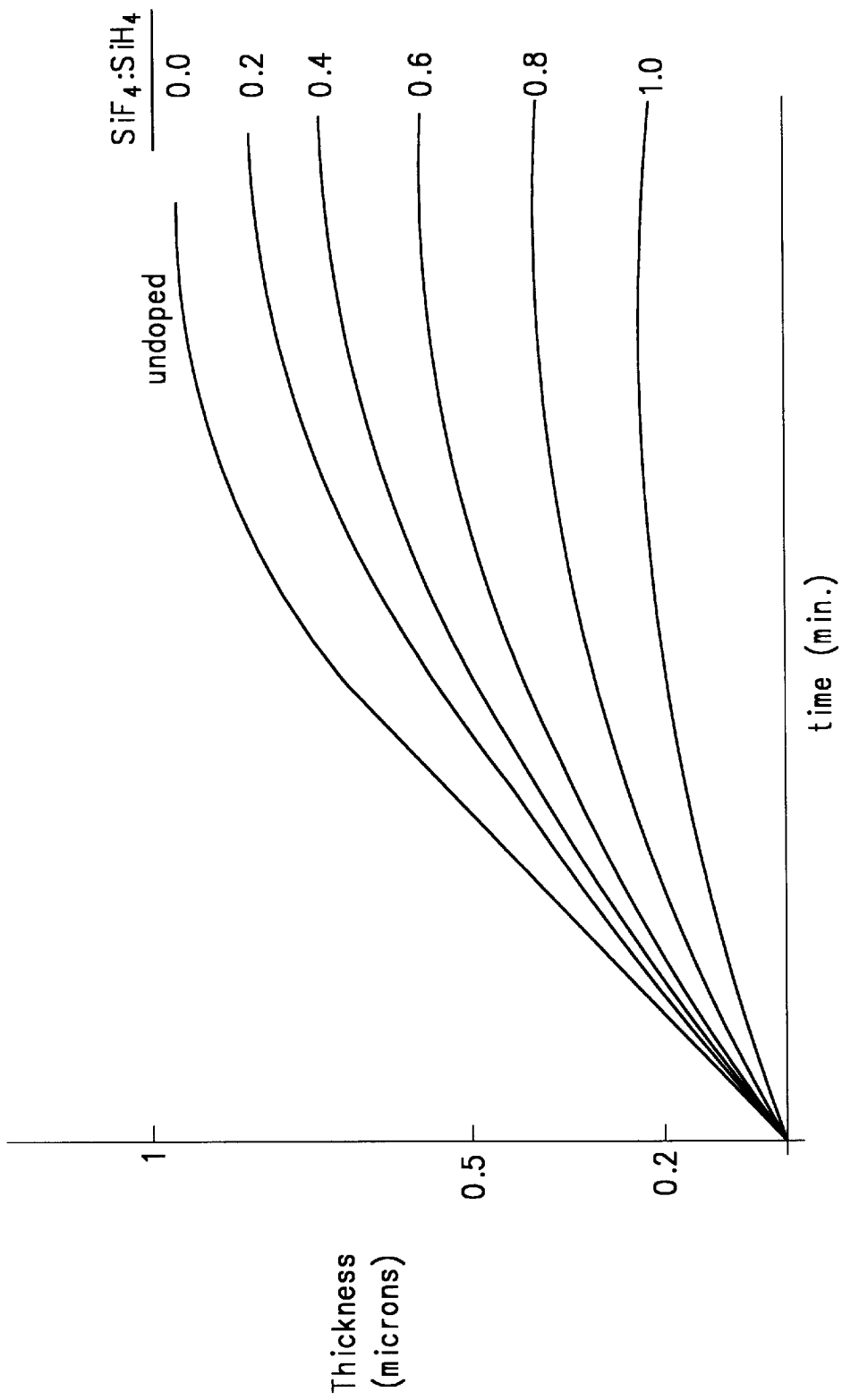
FIG. 2 is a graph representing the rate of growth of an FSG layer for various ratios of $SiF_4:SiH_4$.
Figure 3:
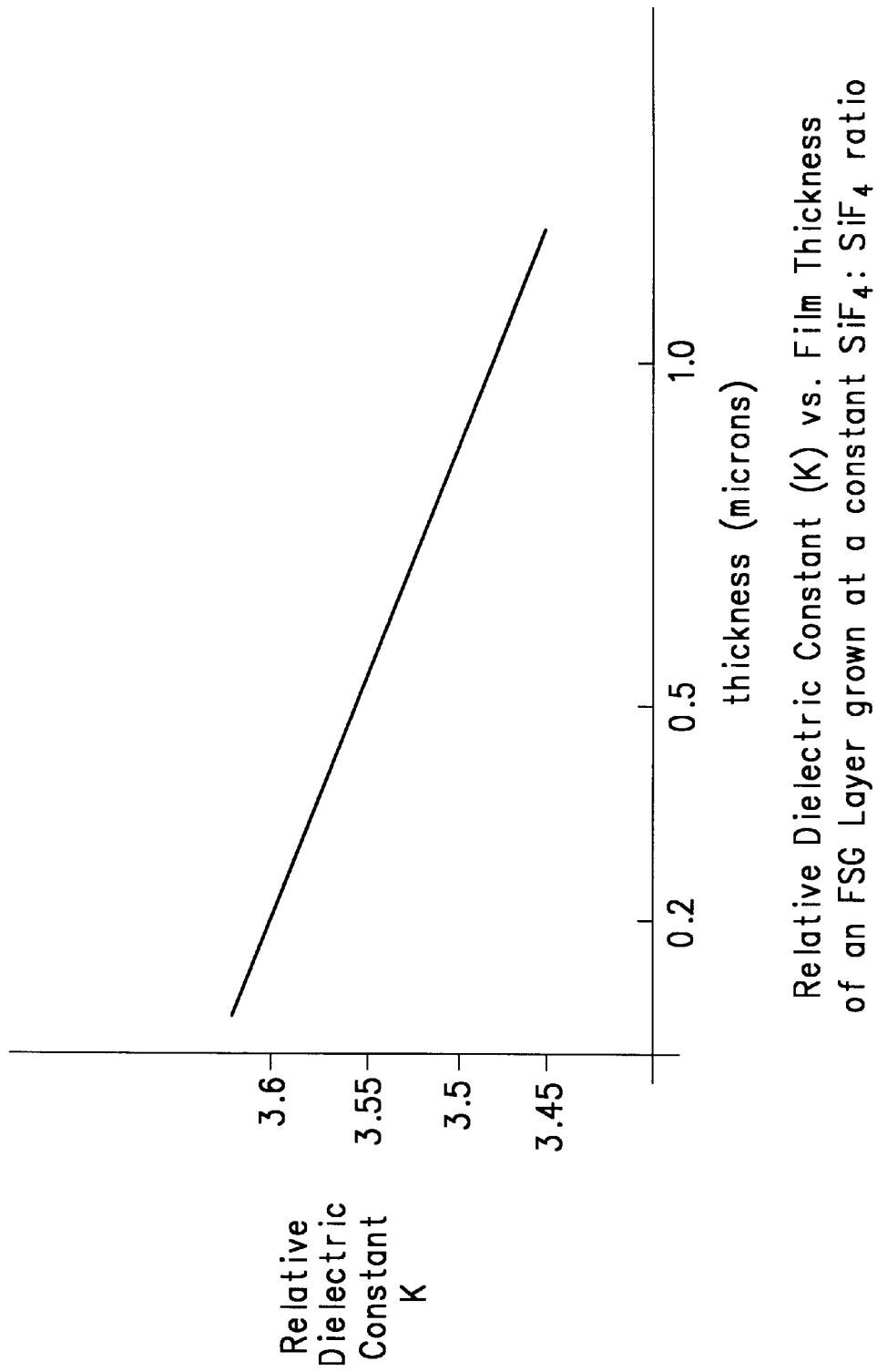
FIG. 3 is a graph showing the decrease in dielectric constant versus film thickness of an FSG layer grown at a constant $SiF_4:SiH_4$ ratio of 0.5.
Figure 7A:
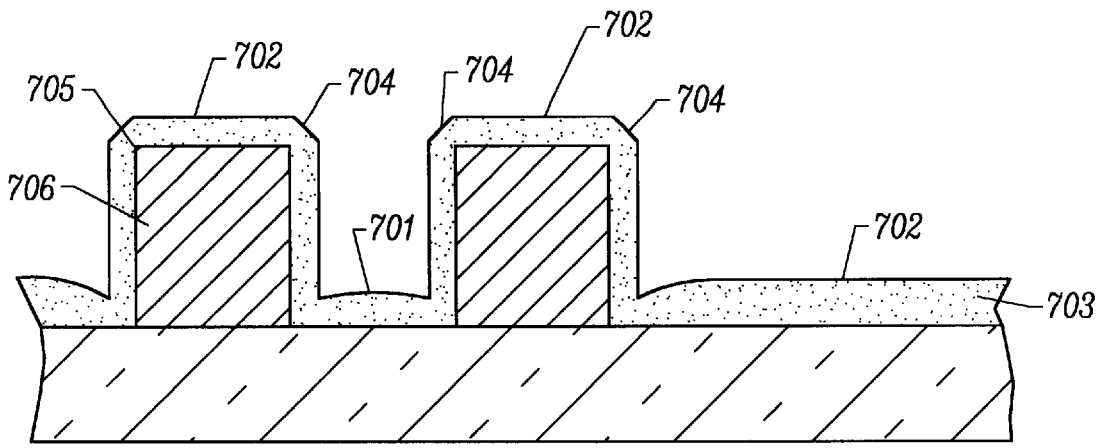
FIGS. 7A, 7B, and 7C are simplified cross-sectional views of an insulating film being deposited in a gap, according to the present invention.
Figure 7B:
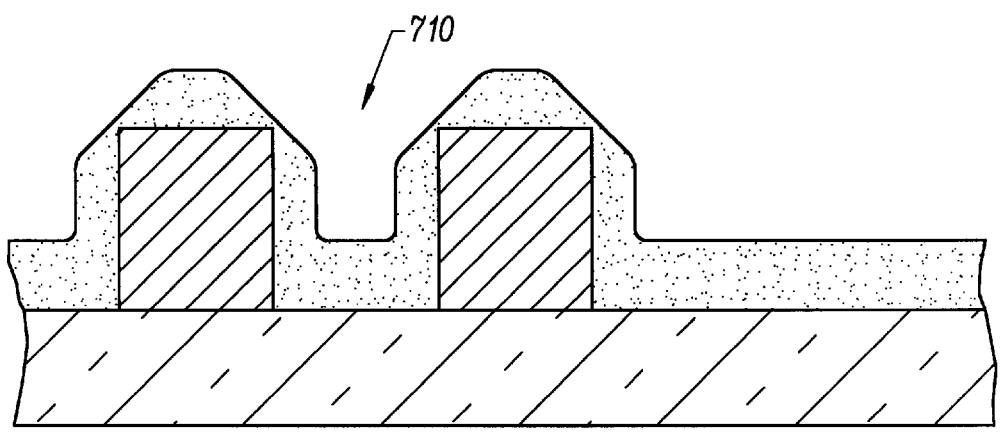
Figure 7C:
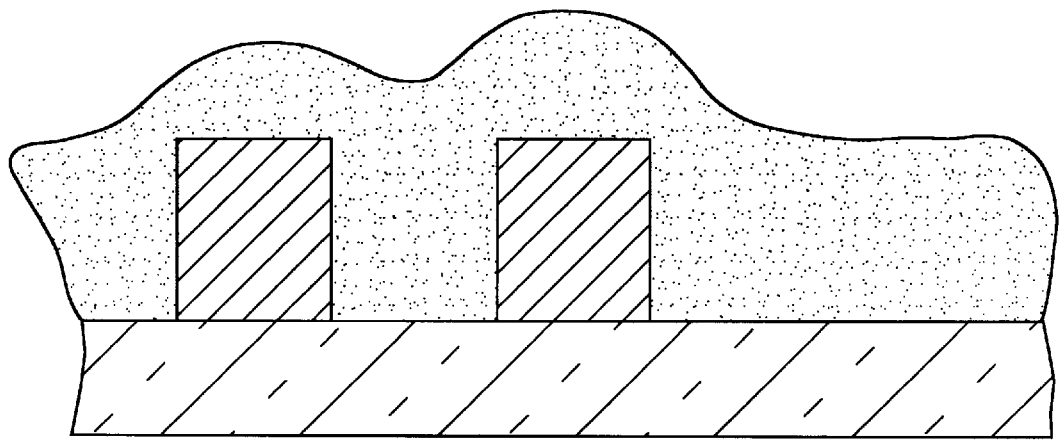

FIGS. 7A through 7C show a vertical cross-section of a substrate processed according to the present invention. The theory of the gap filling described for the structure of FIGS. 7A through 7C, with reference to the curves of FIG. 2, applies to a simplified model of FSG layer formation. When a trench having a high aspect ratio is filled, the geometry, surface concentration of reactive species, and reactivity of the layer species changes during the formation of the layer. This may be due to both the diffusion of active species to the bottom of the trench 701 and the effect of the plasma-enhanced reactions within the trench. Typically, the initial rate of deposition on the field 702 (upper surface) of the substrate may be about 1.2–1.4 times the initial rate of deposition at the bottom of trench 701. Because an etchant is present during deposition, the dielectric layer 703 forms facets 704 at the corners 705 of features 706, allowing the trench 710 (FIG. 7B) to fill, as shown in FIG. 7C, without leaving a gap.

Both the deposition rate and etch rate are temperature dependent, and therefore controlling the temperature may affect the ratio of the deposition rate to the etch rate. The RF power and heat of reaction combine to heat the substrate. Although the substrate is cooled by applying a stream of helium gas between the substrate and the wafer holder, the closed-loop, wafer-holder cooling system does not assure a constant substrate temperature.

Figure 4:
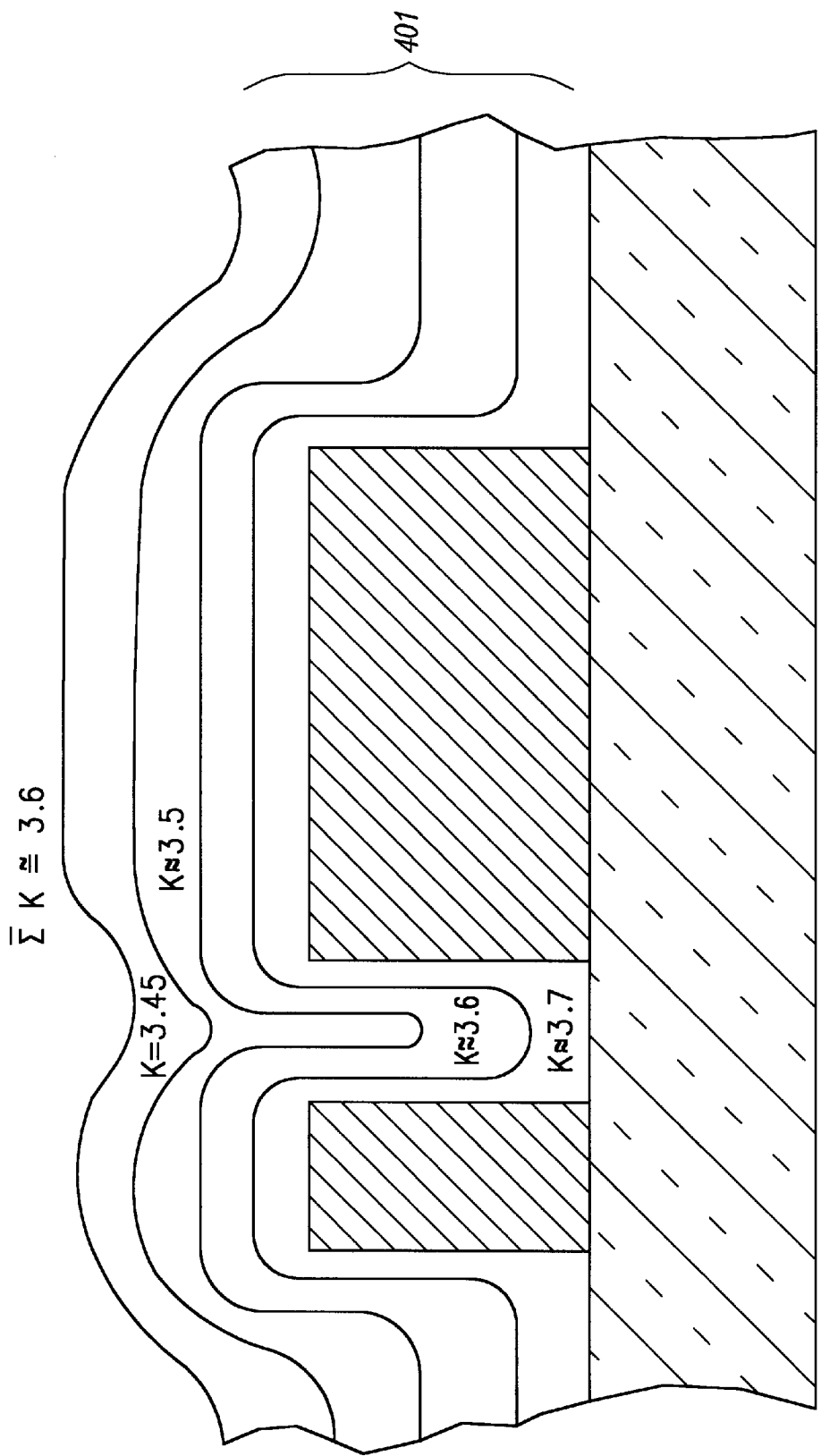
FIG. 4 is a vertical cross-sectional view of the prior-art FSG layer when deposited with a constant $SiF_4:SiH_4$ ratio of nominally 0.5, showing a variation in the relative dielectric constant.
Figure 8:
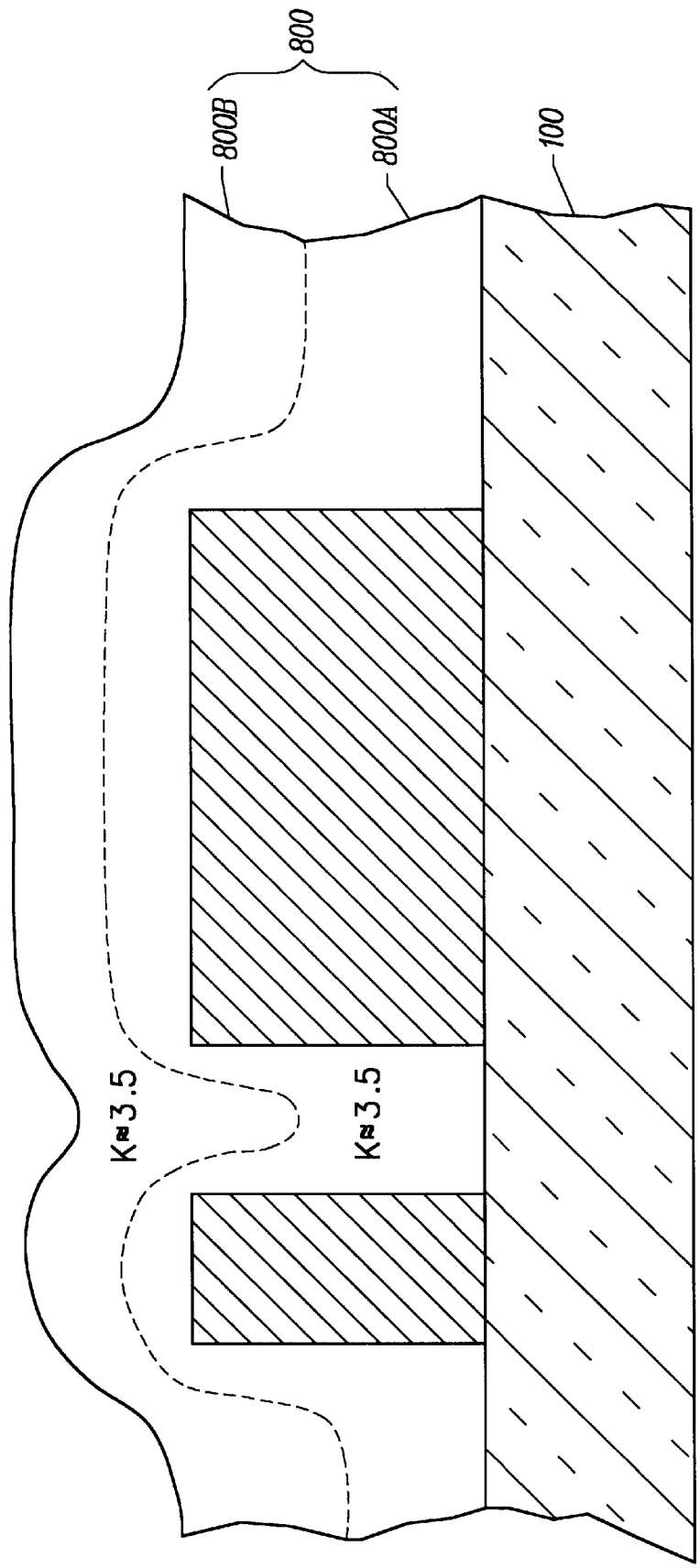
FIG. 8 is a simplified cross-sectional view of an insulating film deposited according to the present invention.

Referring now to FIG. 8, an insulating film 800 formed on a substrate 100 according to an embodiment of the present invention is shown. Insulating film 800, which may be used in any of the dielectric layers of circuit 600, is a fluorine-doped silicon oxide film providing a conformal layer with a low dielectric constant, good gap-fill properties and high stability grown at a relatively rapid overall rate. Additionally, the dielectric constant is about constant throughout portions 800A and 800B of layer 800. This is in contrast to the prior-art layer shown in FIG. 4, where the dielectric constant varies within the layer.

Figure 9:
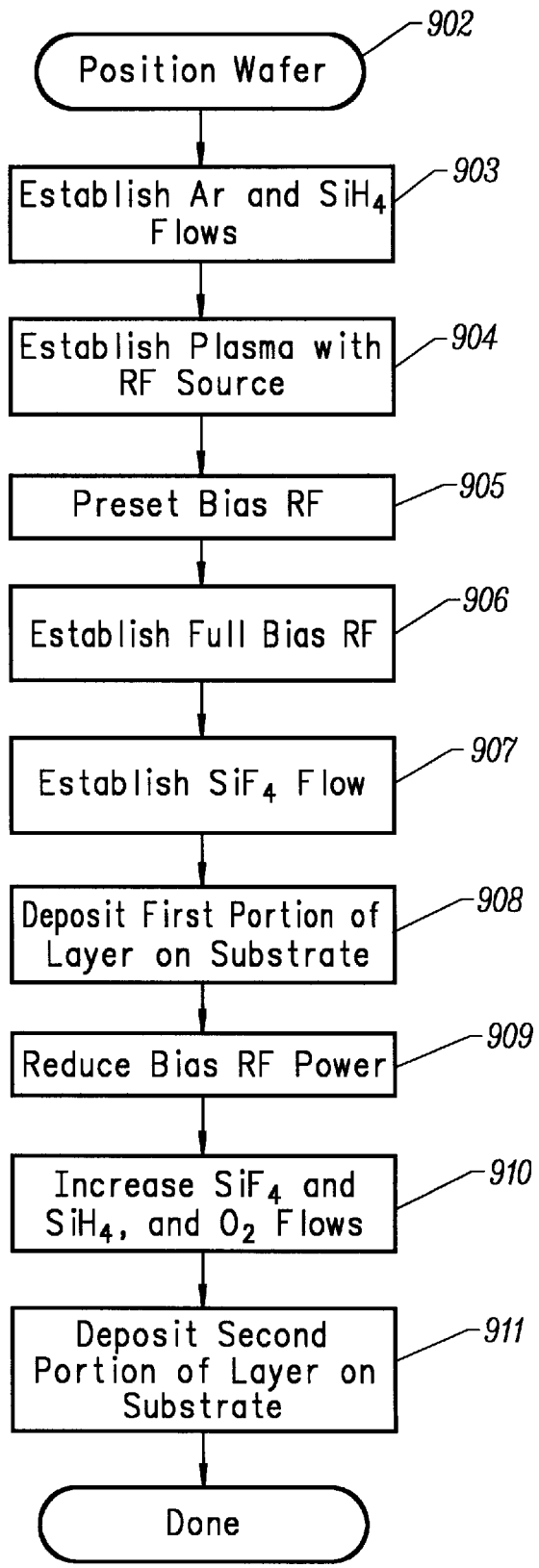
FIG. 9 is a flow chart illustrating the steps performed in applying an insulating film using a process according to the process of the present invention.

FIG. 9 shows a flow chart of an exemplary process that used in a preferred embodiment to deposit an insulating layer as shown in FIG. 8. To form insulating layer 800 according to the invention, substrate 17 (FIG. 5A) is loaded into process chamber 13 through a vacuum-lock door (not shown) onto substrate support member 18 (FIG. 9, step 902). Once the substrate is properly positioned, gas flows are established (step 903). Preferably, process gas is introduced at a chamber pressure of about 2–10 millitorr, or preferably at about 4 millitorr. Pressure may be maintained throughout the deposition of film 800 by manipulating throttle valve 26 with a stepper motor (not shown), while the vacuum pump 28 pumps at a constant capacity.

Once gas flows and pressure are established, the RF source bias is applied to establish a plasma within the chamber (step 904). After the source RF is established, the bias RF is preset (step 905) (turned on at a relatively low power level to establish proper operating conditions) before applying full bias RF (step 906). Once the bias RF is established, the $SiF_4$ gas flow is established (step 907). Although some deposition onto the substrate occurs as soon as the bias RF is established, the $SiF_4$ flow follows immediately after, so that substantially all of the deposited layer contains fluorine.

A first portion of the layer is deposited on the substrate in step 908. After that first portion of the layer is deposited, the bias RF power is reduced approximately 10% (step 909), which reduces wafer heating. If another portion of the layer is to be deposited, the $SiH_4$, $O_2$, and $SiF_4$ gas flows are increased (step 910), and a second portion of the layer is deposited (step 911).

The process gas includes $SiH_4$, $SiF_4$, oxygen, and argon or a similar inert gas. Other sources of silicon (e.g., TEOS, etc.) and fluorine (e.g., $CF_4$, etc.) may also be used to form films according to the present invention. In one specific embodiment, $SiH_4$ and $SiF_4$ are introduced into process chamber 10 in a ratio of approximately 0.75 parts $SiF_4$ to 1 part $SiH_4$ in step 908, and 0.81 parts $SiF_4$ to 1 part $SiH_4$ in step 911. The process gas may be formed from 5–100 sccm $SiF_4$, 15–120 sccm $SiH_4$, and 25–300 sccm $O_2$. Argon is introduced at a rate of between about 10 to 50 sccm, and most preferably at a rate of about 45–50 sccm. These gas flow rates are given for a chamber having a volume of about 20 liters adapted to accommodate wafers with diameters ranging from about 127 mm to 300 mm. Those skilled in the art will recognize that the gas flow rates will vary with chamber size and should be adjusted accordingly.

During deposition (steps 908, 911) of film 800, the temperature at the surface of the substrate is maintained between 0 and 500° C., preferably at about 350° C. Because these types of films generally have a higher quality (more nearly like a thermally grown film) when deposited at a higher temperature, it may be desirable to have the surface temperature of the substrate as high as possible, without causing damage to pre-existing structures on the substrate. However, an upper temperature limit may arise due to prior layers on the substrate. For example, substrates with aluminum layers are generally not heated above about 350–400° C. because damage to the aluminum layers may occur. In this system, the substrate is cooled by a heat-transfer gas, such as helium, circulating in an outer cooling ring and an inner cooling ring, situated in the electrostatic chuck (20, FIG. 5A), below the lower surface of the substrate. The electrostatic chuck retains the substrate with electrostatic force, in a manner well known to those skilled in the art.

It is further desirable to keep the substrate at a temperature that allows a rapid deposition rate. The plasma can heat the surface of the substrate, as can an exothermic reaction of deposition gases on the surface of the substrate. Because the chemical composition of the layer, speed of formation of the layer, and damage to existing features on the substrate all depend on the temperature at the surface of the substrate, it is important to control the parameters contributing to this temperature. The cooling system keeps the water temperature circulating in the wafer holder at 65° C., but the temperature of the surface of the substrate may be higher, creating a temperature gradient across the substrate and wafer holder. Because the bias plasma energy heats the substrate, reducing the bias plasma power reduces the rate of heating and lowers the surface temperature of the substrate. This increases the rate of growth of the layer.

During the deposition, argon gas is admitted to the chamber through top nozzle 45 and source gas nozzles 39. RF energy is applied to top coil 29 and side coil 30 by SRF generators 31A and 31B to form an inductive plasma. SRF generators 31A and 31B continue to apply RF energy to the top and side coils throughout this process. SRF generators 31 A and 31 B are driven at a nominal frequency of about 2 MHz at about 0–5000 W, but preferably at about 4400 W. This power is split between the top coil 29, which may be driven at about 1.8 MHz, for example, and the side coil 30, which may be driven at about 2.1 MHz, for example. The top coil may receive about 1300 W and the side coil about 3100 W. Additionally, BRF generator 31C is driven at a frequency of about 13.56 MHz and a power of about 3350 W during step 908 and 3000 W during step 911. The power from BRF generator 31C is delivered to the substrate receiving portion 19, with the chamber body member 22 supplying the complementary electrode for capacitive coupling.

Table 1 shows one recipe for a two-step deposition process according to the present invention. The result is a layer similar to that shown in FIG. 8, having a substantially uniform dielectric constant of about 3.5. One parameter of each step is the deposition-to-etch (D/E) ratio. The D/E ratio is defined for purposes of this discussion as:

$$D/E = D_s/(D_s + D_{s+b})$$

where $D_s$ is the deposition rate with only the source RF applied, and $D(s+b)$ is the deposition rate with both the source and bias RF applied. This embodiment of the present invention may be used in sub–0.25 μm devices having aspect ratios of about 4:1. The chamber pressure may be between about 2 and 10 millitorr, preferably about 4–5 millitorr. Above about 10 millitorr the trenches do not fill in without forming gaps.

TABLE 1

PROCESS CONDITIONS FOR DEPOSITION OF AN FSG LAYER IN HIGH ASPECT RATIO TRENCHES

|  | STEP 1 | STEP 2 |
|---|---|---|
| Time (seconds) | 57 | 25 |
| Source RF Power (W) | 4400 | 4400 |
| Bias RF Power (W) | 3350 | 3000 |
| Chamber Pressure (millitorr) | 4–5 | 4–5 |
| D/E Ratio | 2.0 | 4.0 |
| SiF$_4$ Flow (sccm) | 48 | 90 |
| Top SiH$_4$ Flow (sccm) | 9.6 | 11.5 |
| Side SiH$_4$ Flow (sccm) | 54 | 99 |
| Top O$_2$ Flow (sccm) | 16.4 | 20 |
| Side O$_2$ Flow (sccm) | 102.6 | 275 |
| SiF4:SiH$_4$ Ratio | .75 | .81 |

In another embodiment, the fluorine-to-silicon ratio is adjusted during the process to modify the deposition-to-etch characteristics without adjusting the RF bias power level. Silicon tetrafluoride and silane are introduced into the process chamber in a ratio of approximately 0.70 parts SiF$_4$ to 1 part SiH$_4$ at the beginning of the deposition sequence. The ratio of SiF$_4$ to SiH$_4$ is reduced to approximately 0.50 by the end of the process. The ratio may be altered in a stepwise fashion, or continuously varied from the initial condition to the final condition. Chamber conditions were calibrated using the wet etch rate ratio (WERR) to provide a substrate surface temperature of between about 350–400° C. during the deposition process. The WERR method compares the etch rate of a deposited SiO$_2$ layer with the etch rate of a thermally grown SiO$_2$ layer, as known to those skilled in the art. The relatively high initial concentration of fluorine results in an initial deposition-to-etch ratio of about 1.5, while the final concentration of fluorine results in final deposition-to-etch ratio of about 2.0. The resultant layer has a uniform relative dielectric constant of about 3.5. In this instance, the variation in the deposition-to-etch ratios arises from the relative fluorine concentrations. Changing the chamber conditions, such as changing the deposition temperature, may change the deposition-to-etch ratios, and hence the deposition rates.

While the above methods are appropriate for a 200 mm wafer in a nominally 5 liter chamber, the methods of the present invention are not intended to be limited by the specific parameters set forth above. Those of ordinary skill in the art will realize that processing parameters, such as gas flow rates, can vary for different processing chambers and different processing conditions, and that different reactant sources can be used without departing from the spirit of the invention. For example, the process described above may be adapted for a 150 mm or 300 mm wafer, or for a processing chamber with a different volume or exhaust capacity, or a processing chamber that generates a plasma remotely from the processing zone. Other equivalent or alternative methods of depositing an insulating layer according to the present invention will be apparent to those skilled in the art. For example, films produced according to embodiments of the present invention may include heating cycles to further stabilize the film. These equivalents and alternatives are intended to be included within the scope of the present invention. Other variations will be apparent to persons of skill in the art. Accordingly, it is not intended to limit the invention except as provided in the appended claims.

What is claimed is:

1. A method for forming a film on a substrate having a gap, the method comprising the steps of:
    (a) flowing a silicon-containing gas, a halogen-containing gas, and oxygen into a chamber at a first flow rate;
    (b) creating a plasma in said chamber with an RF source generator;
    (c) applying RF bias power at a first bias power level to said plasma with an RF bias generator;
    (d) depositing a first portion of the film on the substrate at a first deposition-to-etch ratio, said first portion of the film partially filling the gap in the substrate;
    (e) increasing said first flow rate of said silicon-containing gas and said halogen-containing gas and said oxygen to a second flow rate;
    (f) reducing said RF bias power to a second bias power level; and
    (g) depositing a second portion of the film on the substrate at a second deposition-to-etch ratio wherein said second deposition-to-etch ratio is greater than said first deposition-to-etch ratio, said first and second portions of the film filling the gap in the substrate.

2. The method of claim 1 wherein said RF source generator operates at a source frequency of about 2 MHz and a source power level of between about 12–16 W/cm$^2$, and said RF bias generator operates at a frequency of about 13.56 MHz and a bias power level of between about 7–13 W/cm$^2$.

3. The method of claim 1 wherein said silicon-containing gas is SiH$_4$ and said halogen-containing gas is SiF$_4$.

4. The method of claim 1 wherein the step (f) of reducing said RF bias power to the second bias power level is performed while maintaining the RF source power substantially constant.

5. The method of claim 1 wherein the RF source generator is operated at a frequency of nominally 2 MHz to create the plasma.

6. The method of claim 1 wherein the RF bias generator is operated at a frequency of 13.56 MHz to apply the RF bias power.

7. The method of claim 1 wherein the RF bias power is reduced to the second bias power level to decrease an etch rate of the film by decreasing activity of etchant species produced from the gases in the chamber and to increase a deposition rate of the film by reducing surface temperature of the substrate.

8. The method of claim 1 wherein said process gas further comprises a sputtering gas.

9. The method of claim 8 wherein the sputtering gas comprises argon.

10. A method for forming a film on a substrate having a gap, the method comprising the steps of:

(a) flowing a process gas comprising silicon, a halogen, and oxygen into a chamber, wherein the halogen and the silicon are in a first ratio, the process gas deriving from a silicon source, a halogen source, and an oxygen source;

(b) depositing a first portion of the film over the substrate, said first portion of the film partially filling the gap in the substrate;

(c) reducing the first ratio of the halogen to the silicon to a second ratio of the halogen to the silicon; and (d) depositing a second portion of the film, said first and second portions of the film filling the gap in the substrate.

11. The method of claim 10 further comprising the step of forming a plasma from the process gas.

12. The method of claim 10 wherein said silicon source comprises $SiH_4$ and said halogen source comprises fluorine.

13. The method of claim 10 wherein said silicon source comprises $SiH_4$, said halogen source comprises $SiF_4$, said first ratio is between about 0.6–0.8 $SiF_4$ to $SiH_4$, and said second ratio is between about 0.4–0.6 $SiF_4$ to $SiH_4$.

14. A method suitable for depositing material in high aspect ratio trenches on a substrate, the method comprising:

(a) flowing a process gas into the process zone, wherein the process gas introduced into the process zone comprises a deposition component and an etchant component;

(b) establishing a plasma with power from an RF source generator;

(c) applying an RF bias power at a first power level to the plasma;

(d) maintaining the process gas and plasma at process conditions suitable for depositing material on the substrate while simultaneously etching a first portion of the material to form a second portion of the material on the substrate to partially fill the trenches; and (e) reducing the RF bias power to a second power level to form a third portion of the material on the substrate to fill the trenches.

* * * * *